United States Patent [19]
Ohashi

[11] Patent Number: 5,661,739
[45] Date of Patent: Aug. 26, 1997

[54] SEMICONDUCTOR LASER DRIVING CIRCUIT

[75] Inventor: Tsuyoshi Ohashi, Hashima, Japan

[73] Assignee: Brother Kogyo Kabushiki Kaisha, Nagoya, Japan

[21] Appl. No.: 582,307

[22] Filed: Jan. 3, 1996

[30]  Foreign Application Priority Data

Jan. 20, 1995  [JP]  Japan .................................. 7-025883

[51] Int. Cl.⁶ ...................................................... H01S 3/00
[52] U.S. Cl. ................................................................ 372/38
[58] Field of Search ................................... 372/38, 29, 32

[56]  References Cited

U.S. PATENT DOCUMENTS

| | | | |
|---|---|---|---|
| 4,009,385 | 2/1977 | Sell | 372/38 |
| 4,771,431 | 9/1988 | Nakazawa et al. | 372/32 |
| 4,819,241 | 4/1989 | Nagano | 372/38 |
| 4,856,011 | 8/1989 | Shimada et al. | 372/38 |
| 5,123,023 | 6/1992 | Santarelli et al. | 372/29 |

FOREIGN PATENT DOCUMENTS 5-145154  6/1993  Japan .

*Primary Examiner*—Leon Scott, Jr.
*Attorney, Agent, or Firm*—Oliff & Berridge

[57]  ABSTRACT

When a laser turn-on signal LS of "H" level is input to an input terminal at a time t0 to form an image, at the time t0 the positive input terminal of an operational amplifier is instantaneously supplied with a reference voltage Vk which is switched to "0.7 V", so that the output voltage Vb of the operational amplifier is increased and first and second transistors are set to a conduction state. At time t0, the supply of the driving current I to the semiconductor laser is started and the laser intensity of the laser beam increases and reaches an image-formable laser intensity at a time t2.

17 Claims, 8 Drawing Sheets

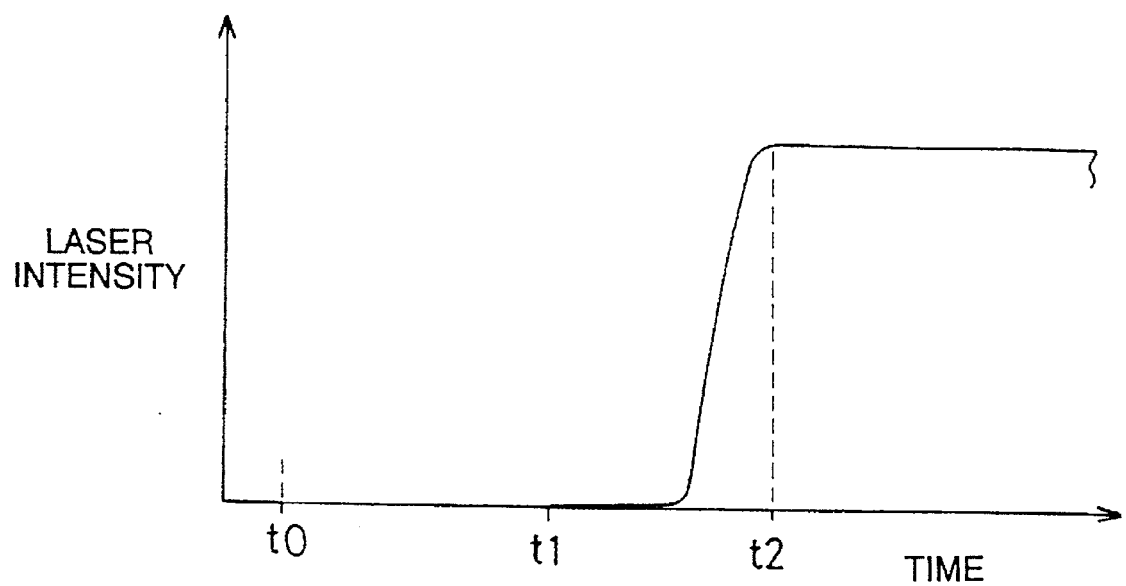

SEMICONDUCTOR LASER DRIVING CIRCUIT

BACKGROUND OF THE INVENTION

1. Field of the Invention

The invention relates to a semiconductor laser driving circuit applied to an image forming apparatus, such as a laser printer or a laser facsimile. More particularly, the invention relates to a semiconductor laser driving circuit capable of shortening a rise-up time from the time when the circuit receives a semiconductor laser turn-on signal until the time when the semiconductor laser emits a laser beam having an intensity large enough to form an image.

2. Description of Related Art

In conventional semiconductor lasers, the intensity of a laser beam varies even with the same driving current or its laser intensity varies based on the temperature variation of the semiconductor laser due to self-heating. Therefore, the semiconductor laser driving circuit of the conventional lasers include a current control circuit for feeding back the output of a monitor photodiode provided to the semiconductor laser so as to control a driving current for the semiconductor laser so that a laser beam having a predetermined laser intensity is emitted.

FIG. 7 shows a conventional semiconductor laser driving circuit 100. The semiconductor laser driving circuit 100 includes a semiconductor laser chip 110 having a semiconductor laser 111 and a photodiode 112. The photodiode 112 outputs a monitor current Im corresponding to the intensity of a laser beam emitted from the semiconductor laser 111. The monitor current Im having a monitor voltage Vm is input to a positive (+) input terminal of an operational amplifier (differential amplifier) 131 of a peak hold circuit 130. The output of the operational amplifier 131 is supplied as a peak monitor voltage Va to the negative (−) input terminal of the operational amplifier 141 of the driving control circuit 140. The positive (+) input terminal of the operational amplifier 141 is supplied with a predetermined reference voltage Vk (for example, about 0.7 V). The output voltage Vb of the operational amplifier 141 is supplied to the base of a transistor 151 of a transistor composite connection type amplifying circuit 150. When the transistor 151 is set to a conduction state, the transistor 152 is simultaneously set to a conduction state, so that a driving current I due to application of a predetermined voltage V2 flows through the transistor 152 into the semiconductor laser 111 and a laser beam is emitted from the semiconductor laser 111.

The driving current I of the semiconductor laser 111 is controlled to be negatively fed back by the peak monitor voltage Va, so that the input voltage Va to the operational amplifier 141 is controlled to be a predetermined voltage relative to the reference voltage Vk at all times, even when the laser intensity of the semiconductor laser 111 varies, that is, the peak monitor voltage Va of the negative (−) input terminal of the operational amplifier 141. Therefore, the laser intensity of the semiconductor laser 111 is controlled to be stable at all times.

A modulation circuit 170 bypasses (modulates) the driving current I supplied to the semiconductor laser 111 to a ground terminal provided in the modulation circuit 170 to perform an ON/OFF control operation of the driving current I supplied to the semiconductor laser in accordance with image data GS from a control circuit (not shown). The reference voltage Vk is preset so that the laser intensity of the laser beam emitted from the semiconductor laser 111 is equal to a predetermined value.

On the other hand, the negative input terminal of the operational amplifier 141 is supplied with a predetermined voltage V1 (for example, about 5 V) through a transistor 145. When the base of the transistor 145 is supplied with a laser turn-on signal LS of "H" level, the transistor 145 is set to a conductive state, so that the voltage V1 is applied to the negative input terminal of the operational amplifier 141. Since V1>Vk, the voltage V1 applied to the negative input terminal of the operational amplifier 141 is higher than the voltage Vk applied to the positive input terminal of the operational amplifier 141. Therefore, the output voltage Vb of the operational amplifier 141 is forcedly set to "0" V irrespective of the peak monitor voltage Va, and the semiconductor laser 111 is controlled not to emit the laser beam. When the laser turn-on signal LS of "L" level is applied to the base of the transistor 145, the transistor 145 is cut off and, thus, the negative input terminal of the operational amplifier 141 is supplied with the peak monitor voltage Va from the peak hold circuit 130. Therefore, the semiconductor laser 111 is allowed to emit the laser beam and an image can be formed.

Japanese Laid-open Patent Publication No. 5-145154 discloses a technique of performing a digital feedback control of a driving current I of a semiconductor laser 111.

As described above, according to the semiconductor laser driving circuit shown in FIG. 7, when the laser turn-on signal LS is switched from the "H" level to the "L" level at t0, as shown in FIG. 8, the voltage Va of the negative input terminal of the operational amplifier 141 is reduced, as shown in FIG. 9, according to a transient characteristic based on a time constant of a C-R circuit, comprising a capacitor 144 and resistors 142,134,143 because charges which are stocked in the capacitor 144 flow through the resistors 142,134, into the ground and are discharged through the resistor 143. When the voltage Va of the negative input terminal is reduced to a value lower than the reference voltage Vk by a predetermined voltage (at time t1), the output voltage Vb of the operational amplifier 141 is output. Therefore, as shown in FIG. 10, the transistor composite connection type amplifying circuit 150 is actuated, the semiconductor laser 111 is supplied with the driving current I flowing in the transistor 152, and the semiconductor laser 111 emits the laser beam on the basis of its laser intensity characteristic so that an image is allowed to be formed.

That is, the voltage Va of the negative input terminal of the operational amplifier 141 is gradually reduced according to the transient characteristic, shown in FIG. 9, and there occurs a problem that a rise-up time from the time t0, when the laser turn-on signal LS is set to the "L" level, to the image-formable time t2, when the semiconductor laser 111 emits a laser beam having enough laser intensity to form the image, is lengthened as shown in FIG. 10.

As shown in FIGS. 9 and 10, in the case where the voltage Va of the negative input terminal of the operational amplifier 141 is reduced according to the transient characteristic, in many cases, the time t1 when the driving current is supplied to the semiconductor laser 111 is varied due to variation of the power source voltage V1 or variation of the transient characteristic, and the image-formable time t2 is also variable in accordance with the laser intensity characteristic of the semiconductor laser 111 itself. Therefore, when the image-formable time t2 is advanced, a surplus electrostatic latent image is formed prior to a predetermined image-forming area on a photosensitive drum. As a result, toner attached to the surplus electrostatic latent image is attached onto the image recording medium and the image recording medium, such as a recording sheet, is soiled.

SUMMARY OF THE INVENTION

An object of the invention is to provide a semiconductor laser driving circuit which is capable of shortening a rise-up time in which the laser intensity of a semiconductor laser reaches a predetermined value, improving the precision of a rise-up timing and preventing an image recording medium from being soiled by switching a reference voltage to be supplied to a current control circuit.

According to a first aspect of the invention, a semiconductor laser driving circuit comprising a photodiode for converting the laser intensity of a laser beam emitted from a semiconductor laser to an electrical signal, and a current control circuit for feeding back the output of the photodiode to control a driving current of the semiconductor laser so that the semiconductor laser emits a laser beam having a predetermined laser intensity, further comprises a reference voltage switching circuit for receiving a laser turn-on signal of "H" level/"L" level which is input from an external source to control a turn-on/turn-off operation of the semiconductor laser.

According to a second aspect of the invention, in the semiconductor laser driving circuit of the first aspect of the invention, the current control circuit includes a peak hold circuit for receiving the output of the photodiode to hold the peak of the output, a driving control circuit for receiving a reference voltage and the output of the peak hold circuit at positive (+) and negative (−) input terminals thereof respectively, and a transistor composite connection type amplifying circuit for receiving the output of the driving control circuit to control the driving current of the semiconductor laser.

In the semiconductor laser driving circuit of the first aspect of the invention, the photodiode converts the laser intensity of the laser beam emitted from the semiconductor laser to an electrical signal and outputs the electrical signal, and the current control circuit feeds back the output from the photodiode. That is, the output of the photodiode is compared with a reference voltage from the reference voltage switching circuit, and the driving current of the semiconductor laser is controlled so that the semiconductor laser emits a laser beam at a predetermined laser intensity. The reference voltage switching circuit receives the laser turn-on signal of "H" level/"L" level input from an external source to control the turn-on/turn-off operation of the semiconductor laser, thereby switching the reference voltage of the current control circuit.

That is, the reference voltage of the current control circuit is directly supplied from a power source for the reference voltage, and not through a C-R circuit, so that the switching operation of the reference voltage can be performed instantaneously. Thus, there is no response delay at the time when the reference voltage is switched. Therefore, when the reference voltage is switched to turn on the semiconductor laser, the rise-up time at which the laser intensity of the semiconductor laser reaches a predetermined laser intensity sufficient to form an image is dependent on only the laser intensity characteristic of the semiconductor laser, so that the rise-up time can be shortened, the precision of the rise-up timing is improved and the image recording medium can be prevented from being soiled.

In the semiconductor laser circuit of the second aspect of the invention, the same action as the first aspect can be obtained. Since the current control circuit includes the peak hold circuit for receiving the output of the photodiode to hold the peak of the output of the photodiode, the driving control circuit for receiving the reference voltage and the output of the peak hold circuit at the positive and negative input terminals thereof respectively, and the transistor composite connection type amplifying circuit for receiving the output of the driving control circuit to control the driving current of the semiconductor laser, the driving current which is amplified at a large amplification factor by the transistor composite connection type amplifying circuit so that the peak value of the output of the photodiode is substantially equal to the reference voltage is supplied to the semiconductor laser. Thus, minute variations in the laser intensity of the semiconductor laser can be canceled with high precision.

According to the semiconductor laser driving circuit of the first aspect of the invention, there is provided the reference voltage switching circuit for receiving the laser turn-on signal of "H" level/"L" level which is input from the external source to control the turn-on/turn-off of the semiconductor laser, and switching the reference voltage of the current control circuit. Therefore, the reference voltage of the current control circuit is directly supplied from the power source for the reference source, and not through a C-R circuit, so that the reference voltage can be instantaneously switched with no response delay. Accordingly, the rise-up time period from the time when the reference voltage is switched to turn on the semiconductor laser until the time when the laser intensity of the semiconductor laser reaches a predetermined laser intensity sufficient to form an image can be shortened because it is dependent on only the laser intensity characteristic of the semiconductor laser. In addition, the precision of the rise-up timing can be improved and the image recording medium can be prevented from being soiled.

According to the semiconductor laser driving circuit of the second aspect of the invention, since the current control circuit comprises the peak hold circuit, the driving control circuit and the transistor composite connection type amplifying circuit, in addition to the same effect as the first aspect, the minute variation in the laser intensity of the semiconductor laser can be canceled with high precision because the driving current is amplified at a large amplification factor by the transistor composite connection type amplifying circuit so that the peak value of the output of the photodiode is substantially equal to the reference voltage.

BRIEF DESCRIPTION OF THE DRAWINGS

Preferred embodiments of the invention will be described in detail with reference to the following figures wherein:

FIG. 10 is a diagram showing a laser intensity characteristic of a conventional semiconductor laser.

DETAILED DESCRIPTION OF PREFERRED EMBODIMENTS

Preferred embodiments according to the invention will be hereunder described with reference to the accompanying drawings.

Figure 1:
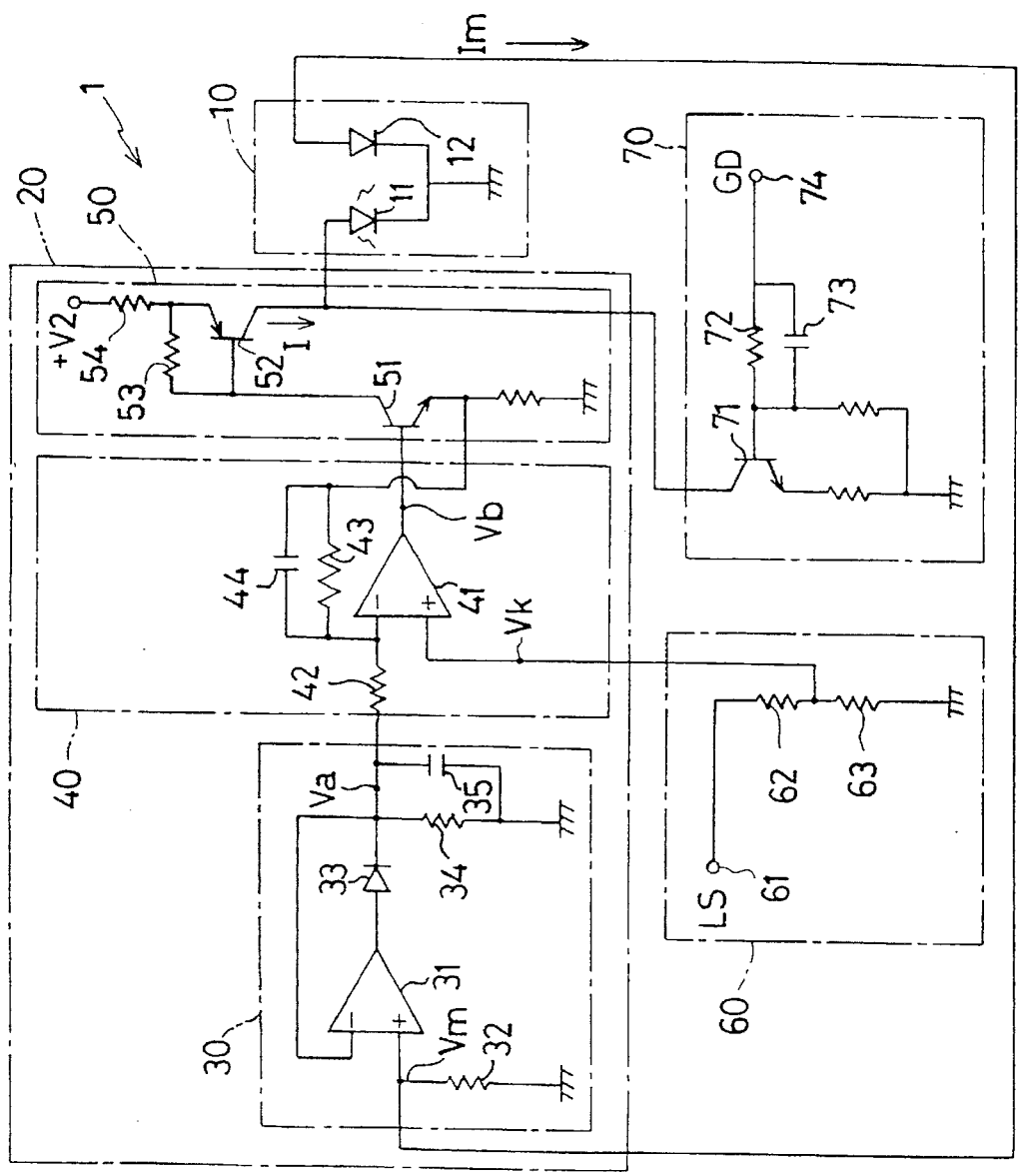
FIG. 1 is a circuit diagram showing a semiconductor laser driving circuit according to a first embodiment of the invention.

FIG. 1 shows a semiconductor laser driving circuit 1 of a first embodiment of the invention which is applied to a printing apparatus, such as a laser printer or a laser facsimile.

The semiconductor laser driving circuit 1 comprises a photodiode 12 provided on a semiconductor laser chip 10, a current control circuit 20 having a peak hold circuit 30, a driving control circuit 40, a transistor composite connection type amplifying circuit 50, and a reference voltage switching circuit 60.

The photodiode 12 is integrally built in the semiconductor laser chip 10 together with a semiconductor laser 11 for emitting a laser beam from the semiconductor laser chip 10. The photodiode 12 converts the laser intensity of the laser beam emitted from the semiconductor laser 11 into a monitor current Im (corresponding to an electrical signal).

Next, the current control circuit 20 will be described in detail.

First, the peak hold circuit 30 receives the monitor current Im output from the photodiode 12 to hold the peak value of the monitor current Im. The positive (+) input terminal of the operational amplifier 31 (differential amplifier) is supplied with the monitor current Im. The operational amplifier 31 is connected to the ground through a resistor 32. The output line of the operational amplifier 31 is connected to a diode 33, and further connected to the ground through a parallel connection circuit of a resistor 34 and a capacitor 35. The cathode of the diode 33 and the negative (−) input terminal of the operational amplifier 31 are connected to each other.

That is, since a voltage follower circuit which uses the operational amplifier 31 and has a peak hold function is provided, the monitor peak voltage Va in the monitor voltage Vm corresponding to the input monitor current Im is held by the C-R circuit, comprising the resistor 34 and the capacitor 35, and then output to the driving control circuit 40.

The driving control circuit 40 performs a negative feedback control such that the monitor peak voltage Va is substantially equal to the reference voltage Vk. The negative input terminal of the operational amplifier (differential amplifier) 41 is supplied with the monitor peak voltage Va through a resistor 42 while the positive input terminal thereof is supplied with the reference voltage Vk supplied from the reference voltage switching circuit 60. The output voltage Vb of the operational amplifier 41 is supplied to the base of a first transistor 51 of the transistor composite connection type amplifying circuit 50. The emitter voltage of the first transistor 51 is applied to the negative input terminal of the operational amplifier 41 through a C-R circuit comprising a resistor 43 and a capacitor 44.

The transistor composite connection type amplifying circuit 50 includes two transistors 51,52 which form a Darlington connection type amplifier to achieve large current amplification. The collector of the first transistor 51 is supplied with a power source voltage V2 through both resistors 53,54 while the emitter of the second transistor 52 is supplied with the power source voltage V2 through the resistor 54. The collector current of the second transistor 52 is supplied as a driving current I to the semiconductor laser 11.

That is, when the monitor peak voltage Va varies relative to the reference voltage Vk by a minute voltage due to variation of the laser intensity, the output voltage Vb of the operational amplifier 41 also varies and thus the emitter current of the first transistor 51 also varies. Therefore, the driving current I of the semiconductor laser 11 varies to correct the laser intensity, so that the monitor peak voltage Va is controlled to be substantially equal to the reference voltage Vk.

The reference voltage switching circuit 60 receives a laser turn-on signal Ls (not shown), and switches the reference voltage Vk to be output to the positive input terminal of the operational amplifier on the basis of "H" level (about 5 V)/"L" level (0 V) of the laser turn-on signal LS. The input terminal 61 of the reference voltage switching circuit 60 to the laser turn-on signal LS is connected to the ground through two potential-dividing resistors 62,63. When the laser turn-on signal LS of "H" level is applied to the input terminal 61, the reference voltage switching circuit 60 outputs a predetermined reference voltage Vk (for example, about 0.7 V) which is determined by the two potential-dividing resistors 62,63. On the other hand, when the laser turn-on signal LS of "L" level is input to the input terminal 61, the reference voltage switching circuit 60 outputs a reference voltage Vk of 0 V. That is, the reference voltage switching circuit 60 switches the reference voltage Vk between two voltages (about 0.7 V and 0 V) on the basis of the laser turn-on signal LS of "H" level/"L" level through the two potential-dividing resistors 62,63, and directly supplies the reference voltage Vk to the positive input terminal of the operational amplifier 41 so that the reference voltage Vk can be instantaneously switched.

Here, the modulation circuit 70 for modulating the laser beam of the semiconductor laser 11 in accordance with image data will be briefly described.

A transistor 71 for bypassing the collector current of the second transistor 52 is provided. The base of the transistor 71 is connected through a parallel-connected resistor 72 and speed-up capacitor 73 to an input terminal 74 to which image data GD of negative logic are input. That is, when image data GD of "H" level are input to the input terminal 74, the transistor 71 is set to a conduction state, and the collector current I of the second transistor 52 flows through the transistor 71. Therefore, the semiconductor laser 11 is supplied with no driving current I for emission of laser beams. Thus, the semiconductor laser 11 does not emit a laser beam and no image is formed. On the other hand, when image data GD of "L" level is input, the transistor 71 is cut off and the collector current I of the second transistor 52 is supplied to the semiconductor laser 11 so that the laser beam is emitted from the semiconductor laser 11 and an image is formed.

In the embodiment as described above, the negative logic image data GD are used. However, the image data GD are not necessarily limited to negative logic image data, and the data may be positive logic image data. It is clear that the semiconductor laser driving circuit of the invention is also usable even when the positive logic image data GD are used.

Next, the laser driving operation of the semiconductor laser driving circuit 1 as described above will be described.

First, following completion of the image formation, the laser turn-on signal LS of "L" level is supplied to the input terminal 61. At this time, the positive input terminal of the operational amplifier 41 is instantaneously supplied with the reference voltage Vk which is switched to "0 V", so that the monitor peak voltage Va supplied to the negative input terminal of the operational amplifier 41 drops through the negative feedback operation of the resistor 43 and the capacitor 44 so that it is substantially equal to the reference voltage Vk. Therefore, the output voltage Vb of the operation amplifier 41 also drops and the emitter current of the first transistor 51 is reduced. As a result, the collector current of the second transistor 52 is reduced and the laser intensity of the semiconductor laser 11 drops.

The monitor current Im from the photodiode 12 then drops. At this time, in the peak hold circuit 30, the monitor peak voltage Va is gradually reduced, on the basis of a time constant of the resistor 34 and the capacitor 35, because the low monitor voltage Vm is not supplied to the cathode of the diode 33. Here, since the monitor peak voltage Va>the reference voltage Vk (Vk=0 V), the output voltage Vb of the operational amplifier 41 is equal to 0 V and the output voltage Vb is below an operation voltage of the first transistor 51. Therefore, the first and second transistors 51,52 are cut off and a laser beam is not emitted from the semiconductor laser 11. Thus, the negative input terminal of the operational amplifier 41 is supplied with the monitor peak voltage Va of "0" V.

Figure 2:
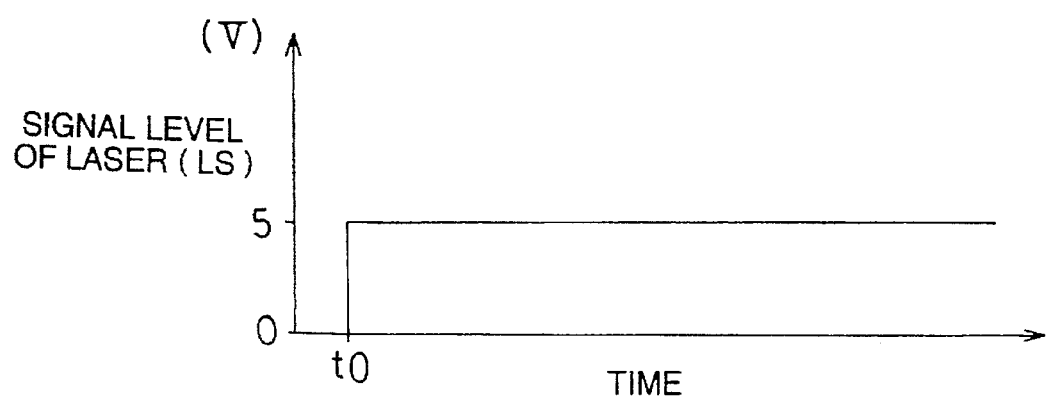
FIG. 2 is a diagram showing a signal level of a laser turn-on signal of the first embodiment.
Figure 3:
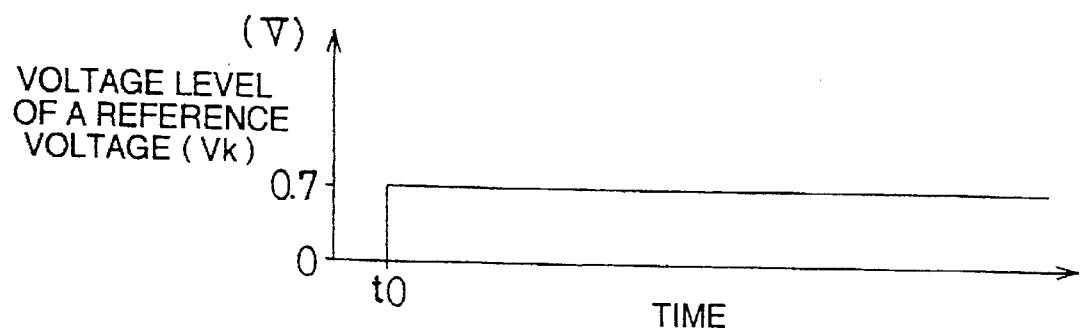
FIG. 3 is a diagram showing a voltage level of a reference voltage of the first embodiment.
Figure 4:
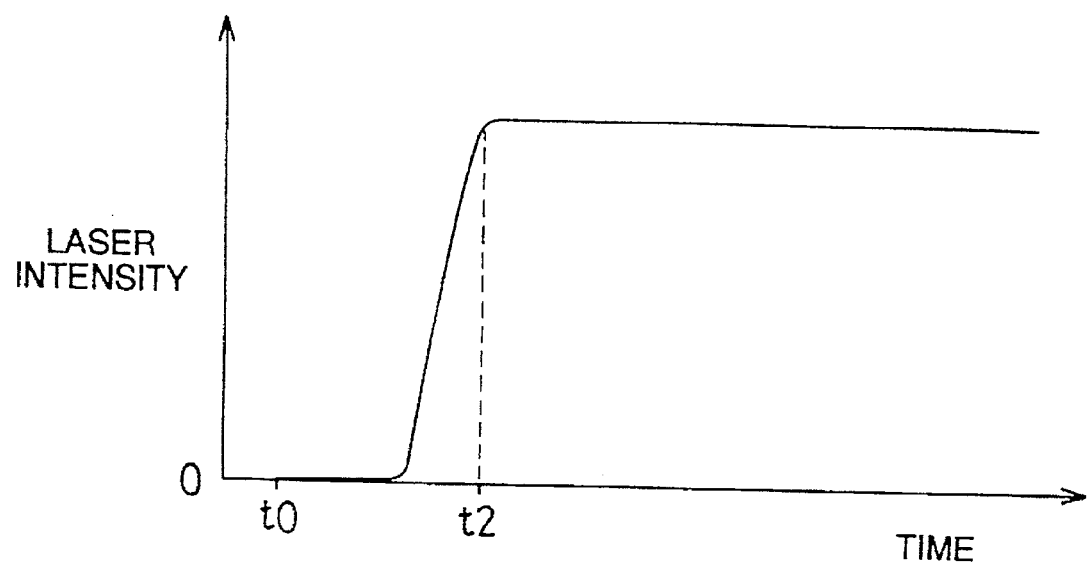
FIG. 4 is a diagram showing a laser intensity characteristic of the semiconductor laser of the first embodiment.

When the laser turn-on signal LS of "H" level is supplied to the input terminal 61 at a time of t0 in order to form an image, as shown in FIG. 2, the positive input terminal of the operational amplifier 41 is instantaneously supplied with the reference voltage Vk which is switched to "0.7 V", as shown in FIG. 3. Therefore, the output voltage Vb of the operational amplifier 41 is increased to set the first and second transistors 51,52 to the conduction state and the supply of the driving current I to the semiconductor laser 11 is started at the time t0. Accordingly, the laser intensity of the laser beam is increased on the basis of the laser intensity characteristic. At time t2, the laser intensity of the laser beam reaches a laser intensity at which an image can be formed. Thereafter, the monitor peak voltage Va, based on the monitor voltage Vm, is negatively fed back so that it is set to a predetermined voltage relative to the reference voltage Vk, and the semiconductor laser 11 emits the laser beam at the predetermined laser intensity.

That is, as the reference voltage switching circuit 60, for receiving the laser turn-on signal LS of "H" level/"L" level input from the external source to control the turn-on/turn-off operation of the semiconductor laser 11, is provided to switch the reference voltage Vk of the driving control circuit 40, the reference voltage Vk of the driving control circuit 40 is directly supplied from the reference voltage switching circuit 60, and not through a C-R circuit, so that the reference voltage can be instantaneously switched, with no response delay, at the switching time of the reference voltage. Therefore, when the reference voltage Vk is switched to turn on the semiconductor laser 11, the rise-up time at which the laser beam emitted from the semiconductor laser 11 has a predetermined laser intensity sufficient to form an image can be shortened because it is dependent on only the laser intensity characteristic. In addition, the precision of the rise-up timing can be improved and the image recording medium will not be soiled.

The current control circuit 20 includes the peak hold circuit 30, for receiving the output of the photodiode 12 to hold the peak value of the output, the driving control circuit 40 having the operational amplifier 41 which receives the reference voltage Vk and the output of the peak hold circuit 30 at the positive and negative input terminals respectively, and the transistor composite connection type amplifying circuit 50 for receiving the output of the driving control circuit 40 to control the driving current I of the semiconductor laser 11. Accordingly, a differential amplification operation is carried out so that the peak value of the output of the photodiode 12 is substantially equal to the reference voltage Vk. As a result, the driving current I, which is amplified at a large amplification factor by the transistor composite connection type amplifying circuit 50, is supplied to the semiconductor laser 11, so that the minute variations in the laser intensity of the semiconductor laser 11 can be accurately canceled with high precision.

Figure 5:
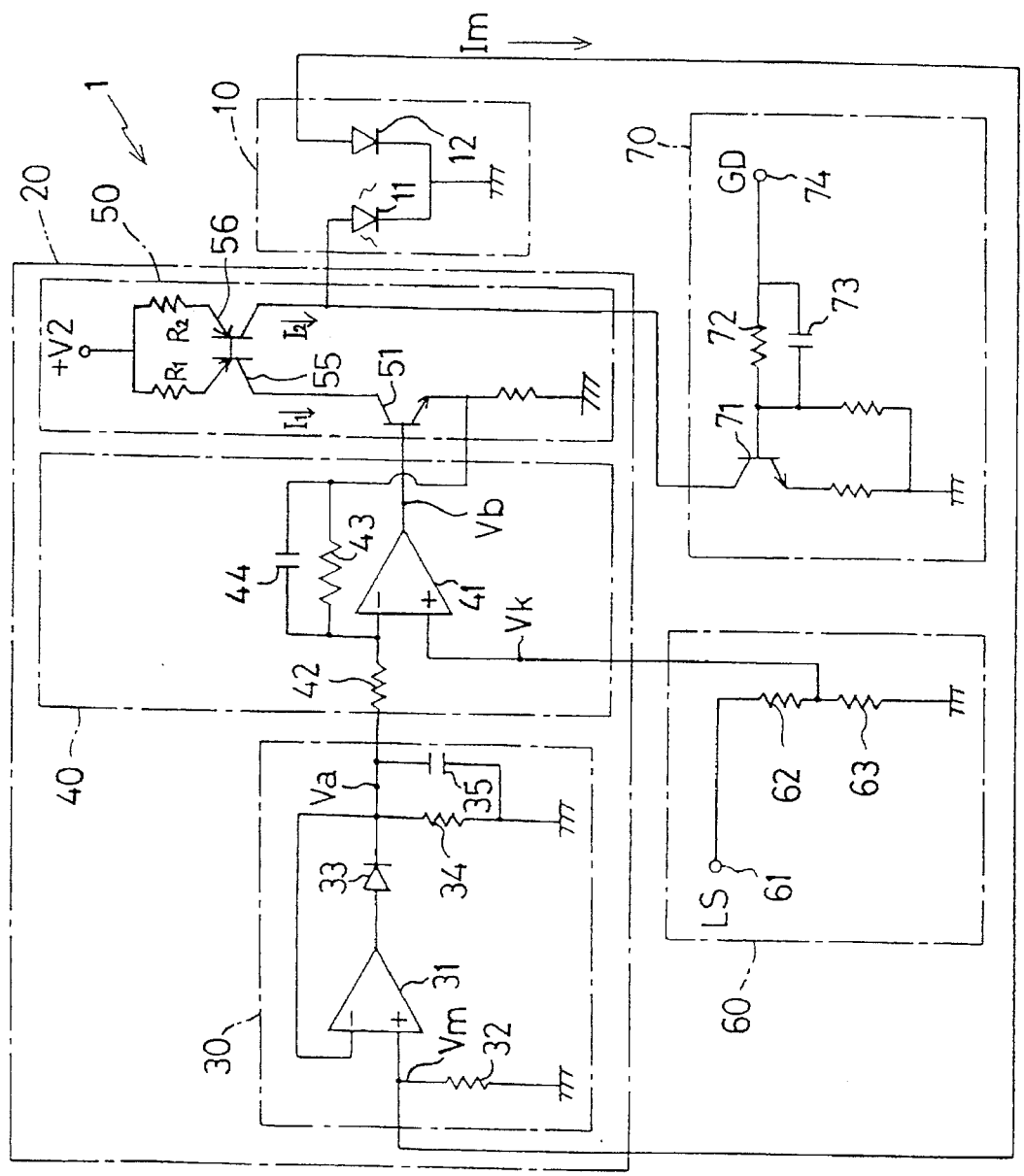
FIG. 5 is a circuit diagram showing a semiconductor laser driving circuit according to a second embodiment of the invention.

The transistor composite connection type amplifying circuit 50 may be of a Darlington connection type or any one of various modified connection types thereof. For example, the current control circuit 20 may be of a current mirror connection type using transistors 55,56 as shown in FIG. 5. In this embodiment, the emitter voltage Ve of the transistors 55,56 satisfies the following relationship: Ve=I1×R1=I2×R2.

Figure 6:
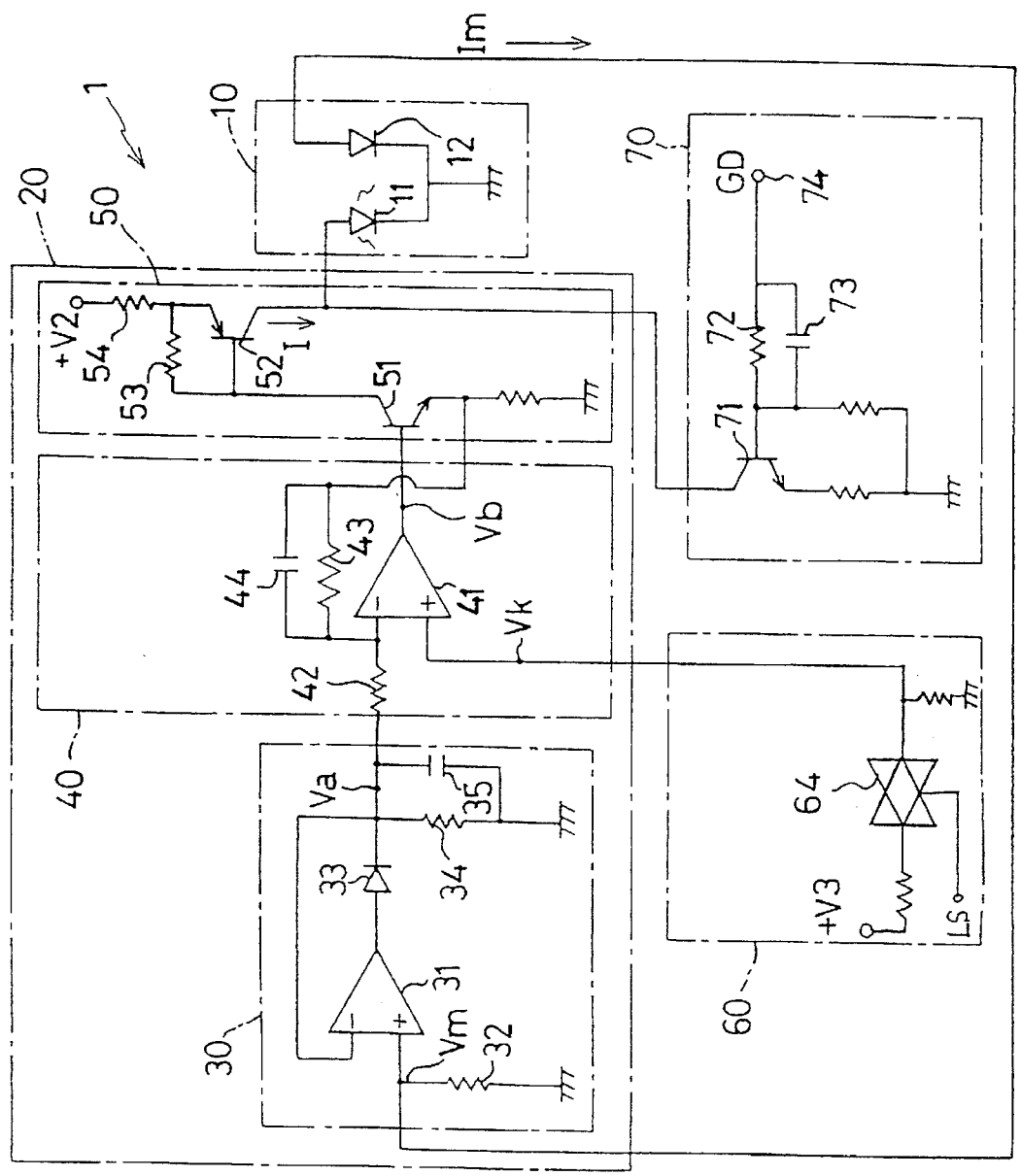
FIG. 6 is a circuit diagram showing a semiconductor laser driving circuit according to a third embodiment of the invention.
Figure 7:
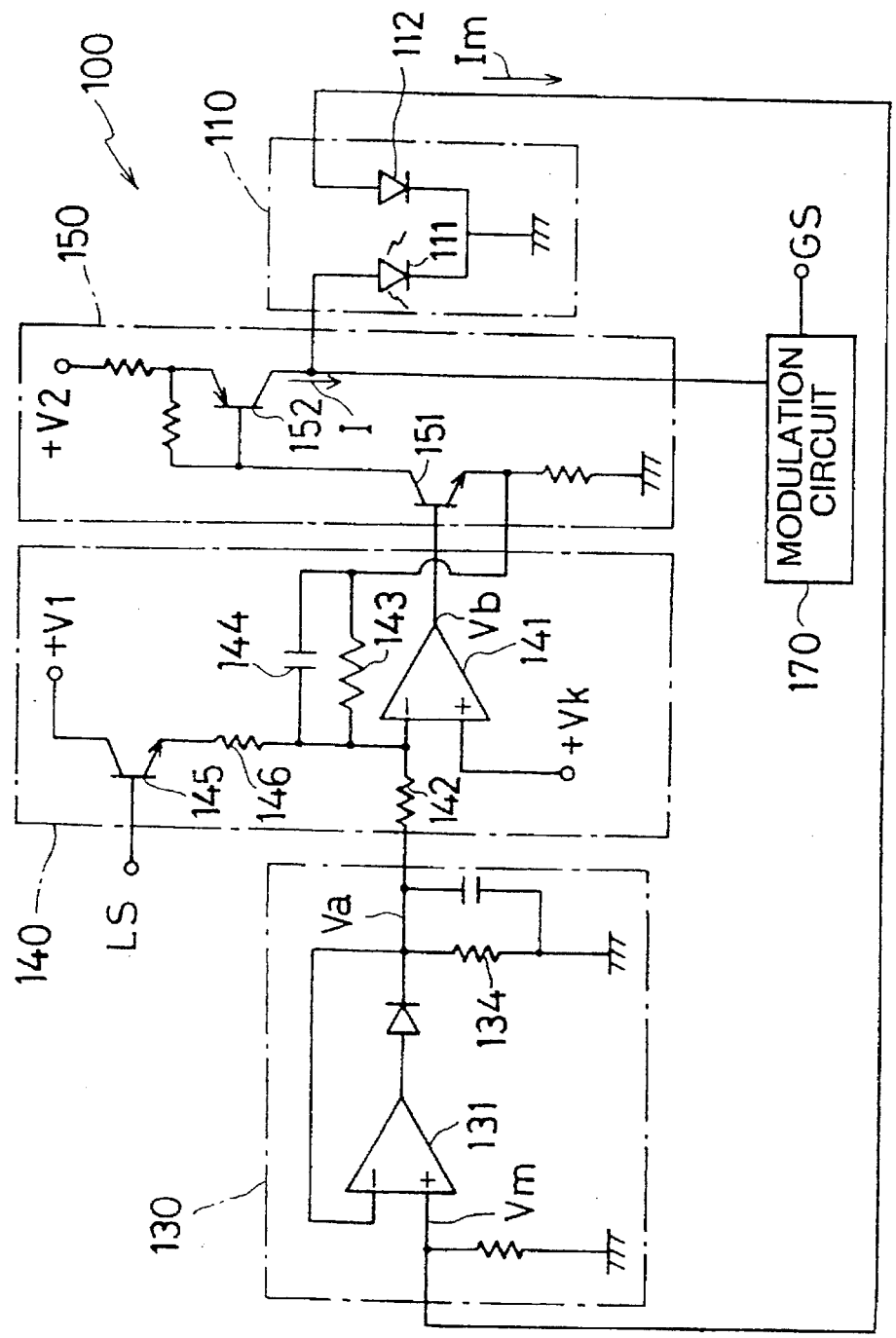
FIG. 7 is a circuit diagram showing a conventional semiconductor laser driving circuit.
Figure 8:
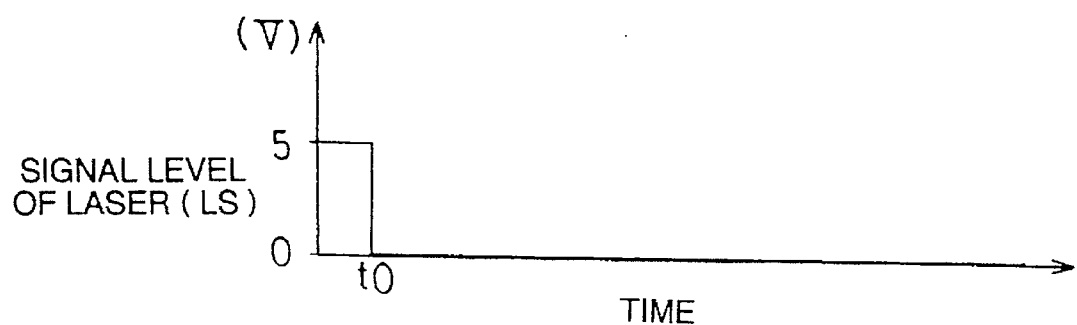
FIG. 8 is a diagram showing a signal level of a laser turn-on signal of the conventional art.
Figure 9:
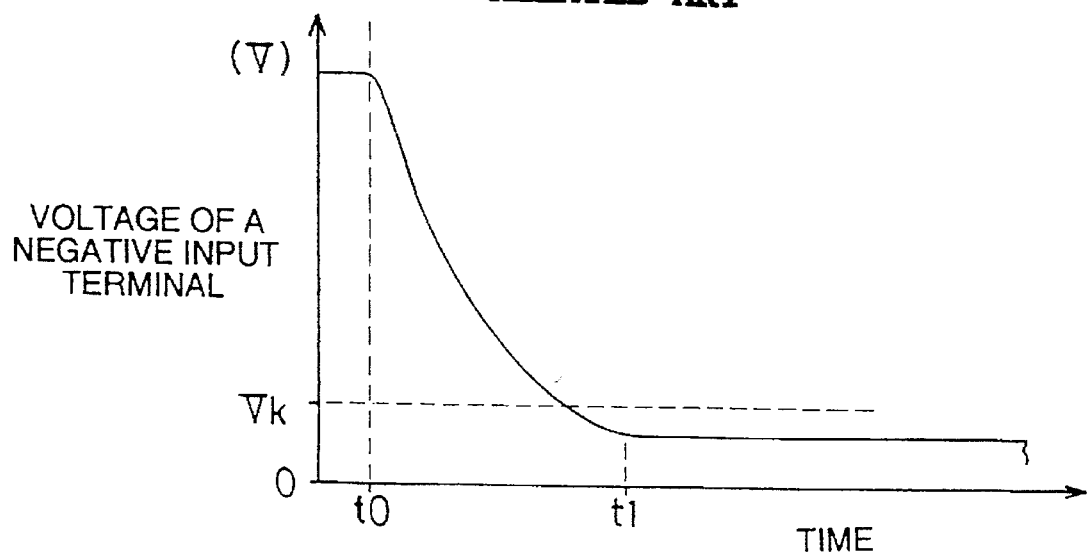
FIG. 9 is a diagram showing a voltage drop characteristic of a negative input terminal of an operational amplifier of a driving control circuit of the conventional art when an image is formed.

Furthermore, an analog switch 64 (FIG. 6) may be provided to the reference voltage switching circuit 60 to switch the reference voltage Vk between "0 V" and "0.7 V". In this case, even when the laser turn-on signal LS contains noise, the reference voltage Vk suffers no ill effects.

The invention is not limited to the above embodiments, and various modifications may be made in a technical scope of the invention on the basis of existing techniques and techniques which are obvious to persons skilled in the art. Furthermore, the invention is applicable to various semiconductor laser driving circuits for laser printing devices, such as facsimile machines and copying machines, in which an image is formed by a semiconductor laser.

What is claimed is:

1. A semiconductor laser driving circuit, comprising:

a photodiode for converting the laser intensity of a laser beam emitted from a semiconductor laser to an electrical signal;

a current control circuit for feeding back the output of the photodiode to control a driving current of the semiconductor laser so that the semiconductor laser emits a laser beam having a predetermined laser intensity; and a reference voltage switching circuit for receiving a laser turn-on signal which is input from an external source to control a turn-on/turn-off operation of the semiconductor laser.

2. The semiconductor laser driving circuit as claimed in claim 1, wherein said current control circuit includes a peak hold circuit for receiving the output of said photodiode to hold the peak of the output of said photodiode, a driving control circuit for receiving a reference voltage and the output of said peak hold circuit at positive and negative input terminals thereof respectively, and a transistor composite connection type amplifying circuit for receiving the output of said driving control circuit to control the driving current of the semiconductor laser.

3. A semiconductor laser driving circuit for a laser printing device, comprising:

a laser chip including a semiconductor laser outputting a laser beam and a photodiode outputting a electrical signal;

a current control circuit controlling a current input to the semiconductor laser to produce a constant intensity laser; and a reference voltage switching circuit outputting a signal to control turn-on/turn-off of the semiconductor laser, the reference voltage switching circuit receiving a laser turn-on signal from an external source.

4. The semiconductor laser driving circuit as claimed in claim 3, further comprising a modulation circuit for damping output from the semiconductor laser based upon image data.

5. The semiconductor laser driving circuit as claimed in claim 3, wherein the current control circuit includes a peak hold circuit for receiving the electrical signal of the photodiode to hold a peak voltage represented by the electrical signal.

6. The semiconductor laser driving circuit as claimed in claim 5, wherein the current control circuit includes a driving control circuit for receiving the peak voltage of the peak hold circuit and the reference voltage of the reference voltage switching circuit and outputting an operating voltage to an amplifying circuit.

7. A semiconductor laser driving circuit, comprising:

a photodiode for sensing the intensity of a laser beam emitted from a semiconductor laser and outputting an electrical signal according to the intensity;

a reference voltage switching circuit for instantaneously generating a reference voltage according to a laser turn-on signal; and a current control circuit for controlling a driving current of the semiconductor laser based on the electrical signal from the photodiode and the reference voltage from the reference voltage switching circuit so that the semiconductor laser emits a laser beam having a predetermined laser intensity.

8. The semiconductor laser driving circuit of claim 7, wherein the current control circuit comprises:

a peak hold circuit for receiving, holding, and outputting the electrical signal from the photodiode;

a driving control circuit for generating a driving signal based on the reference voltage from the reference voltage switching circuit and the electrical signal from the peak hold circuit; and an amplifying circuit that provides driving power to the semiconductor laser according to the driving signal from the driving control circuit.

9. The semiconductor laser driving circuit of claim 8, wherein the peak hold circuit comprises:

an operational amplifier;

a first resistor connected between a positive input terminal of the operational amplifier and ground;

a second resistor connected between an output of the operational amplifier and ground;

and a first capacitor connected between the output of the operational amplifier and ground, wherein the electrical signal from the photodiode is input into the positive input of the operational amplifier, and the negative input terminal of the operational amplifier is connected to the output of the operational amplifier.

10. The semiconductor laser driving circuit of claim 8, wherein the driving control circuit comprises;

an operational amplifier;

a first resistor connected between a negative input of the operational amplifier and the electrical signal output from the peak hold circuit;

a second resistor connected in parallel with a capacitor between the negative input of the operational amplifier and an output of the operational amplifier, wherein the positive input of the operational amplifier is connected to the reference voltage output by the reference voltage switching circuit.

11. The semiconductor laser driving circuit of claim 10, wherein the reference voltage switching circuit comprises:

a first resistor connected between the positive input of the operational amplifier of the driving control circuit and ground; and a second resistor connected between the positive input of the operational amplifier of the driving control circuit and the reference voltage.

12. The semiconductor laser driving circuit of claim 11, further comprising an analog switch connected between the reference voltage and the second resistor.

13. The semiconductor laser driving circuit of claim 8, further comprising a bypass circuit for bypassing power from the amplifying circuit past the semiconductor laser, the bypass circuit having a transistor, a first resistor, a second resistor, a third resistor, and a capacitor, wherein a collector of the transistor is connected to an output of the amplifying circuit, the first resistor is connected between an emitter of the transistor and ground, the second resistor is connected between a base of the transistor and ground, and the third resistor and the capacitor are connected in parallel between the base of the transistor and an external modulation signal.

14. The semiconductor laser driving circuit of claim 8, wherein the amplifying circuit comprises at least one transistor in a transistor composite connection type amplifying circuit.

15. The semiconductor laser driving circuit of claim 14, wherein the at least one transistor is connected in a Darlington type arrangement.

16. The semiconductor laser driving circuit of claim 14, wherein two transistors in the transistor composite connection type amplifying circuit are connected in a current mirror type arrangement.

17. A method for turning on a semiconductor laser in a semiconductor laser driving circuit having a photodiode for sensing the intensity of a laser beam emitted from the semiconductor laser and outputting an electrical signal according to the intensity, a reference voltage switching circuit for instantaneously generating a reference voltage according to a laser turn-on signal, and a current control circuit for controlling a driving current of the semiconductor laser based on the electrical signal from the photodiode and the reference voltage from the reference voltage switching circuit, the current control circuit including an operational amplifier, wherein a negative input of the operational amplifier receives the electrical signal from the photodiode, a positive input of the operational amplifier receives the reference voltage from the reference voltage switching circuit, and an output of the operational amplifier causes the current control circuit to supply power to the semiconductor laser, the method comprising the step of turning on the semiconductor laser by instantaneously applying a predetermined reference voltage from the reference voltage switching circuit to the positive input of the operational amplifier.

* * * * *